United States Patent
Ido et al.

(10) Patent No.: US 8,811,465 B2
(45) Date of Patent: Aug. 19, 2014

(54) RECEPTION DEVICE AND METHOD

(75) Inventors: Jun Ido, Tokyo (JP); Takashi Fujiwara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/823,085

(22) PCT Filed: Dec. 8, 2011

(86) PCT No.: PCT/JP2011/078441
§ 371 (c)(1),
(2), (4) Date: Mar. 13, 2013

(87) PCT Pub. No.: WO2012/086425
PCT Pub. Date: Jun. 28, 2012

(65) Prior Publication Data
US 2013/0177064 A1    Jul. 11, 2013

(30) Foreign Application Priority Data

Dec. 24, 2010    (JP) .................................. 2010-288057

(51) Int. Cl.
*H03H 7/30*    (2006.01)

(52) U.S. Cl.
USPC ........................................................ 375/232

(58) Field of Classification Search
CPC ............ H03M 13/41; H03M 13/1407; H03M 13/6331; H03M 13/658; H04B 7/08; H04B 7/0857; H04L 1/0054; H04L 25/03318; H04L 27/22; H04L 25/03248; H04L 27/38; H04L 1/04
USPC ........................................................ 375/232
See application file for complete search history.

(56) References Cited

U.S. PATENT DOCUMENTS

| 6,081,301 A | 6/2000 | Limberg |
| 6,801,586 B1 | 10/2004 | Imamura |
| 7,583,737 B2 | 9/2009 | Ido et al. |
| 7,652,527 B2 | 1/2010 | Ido et al. |

(Continued)

FOREIGN PATENT DOCUMENTS

| EP | 1 313 282 A1 | 5/2003 |
| JP | 6-334692 A | 12/1994 |

(Continued)

OTHER PUBLICATIONS

Okumura et al., Ido Tsushin no Kiso (Fundamentals of Mobile Communication), IEICE of Japan pp. 163-167, 1987.

*Primary Examiner* — Juan A Torres
(74) *Attorney, Agent, or Firm* — Birch, Stewart, Kolasch & Birch, LLP

(57) ABSTRACT

In a reception device and a reception method for a multivalue VSB, QPSK, or mutlivalue QAM modulated signal, reliability information (R) is generated (22) on the basis of estimation results for the received signal transmission channel, and Viterbi decoding is performed on the basis of the reliability information (R). It may be so arranged that the smaller the absolute value of the difference between the maximum gain and the minimum gain within the transmission frequency band of the output of a transmission channel estimation means (17) is, the higher the reliability indicated by the output reliability information will be. Error correction capabilities can be improved in various transmission channel environments, and errors in transmitted data recovered at the receiving end can be reduced.

26 Claims, 10 Drawing Sheets

(56) References Cited

U.S. PATENT DOCUMENTS

| | | |
|---|---|---|
| 2001/0029596 A1 | 10/2001 | Kim et al. |
| 2002/0152441 A1 | 10/2002 | Senda et al. |
| 2003/0115540 A1 | 6/2003 | Bae et al. |
| 2003/0185147 A1 | 10/2003 | Taga et al. |
| 2004/0229581 A1 | 11/2004 | Mizoguchi et al. |
| 2006/0286948 A1 | 12/2006 | Taniguchi et al. |
| 2008/0291888 A1* | 11/2008 | Maret et al. ............ 370/342 |
| 2009/0122887 A1 | 5/2009 | Li et al. |
| 2010/0142608 A1 | 6/2010 | Kim et al. |
| 2011/0222593 A1* | 9/2011 | Kim et al. ............ 375/232 |
| 2011/0243280 A1* | 10/2011 | Hayashi ............ 375/340 |

FOREIGN PATENT DOCUMENTS

| | | |
|---|---|---|
| JP | 8-331025 A | 12/1996 |
| JP | 11-266192 A | 9/1999 |
| JP | 2000-13128 A | 1/2000 |
| JP | 2001-69117 A | 3/2001 |
| JP | 3344969 | 11/2002 |
| JP | 3377361 B2 | 2/2003 |
| JP | 2003-283454 A | 10/2003 |
| JP | 2004-96703 A | 3/2004 |
| JP | 2004-172699 A | 6/2004 |
| JP | 3662579 B2 | 6/2005 |
| JP | 3724501 B1 | 12/2005 |
| JP | 2006-41980 A | 2/2006 |
| JP | 2006-67123 A | 3/2006 |
| JP | 2007-258794 A | 10/2007 |
| JP | 2008-311868 A | 12/2008 |
| JP | 2009-130486 A | 6/2009 |
| WO | 2004/107622 A1 | 9/2004 |
| WO | 2007/058270 A1 | 5/2007 |

\* cited by examiner

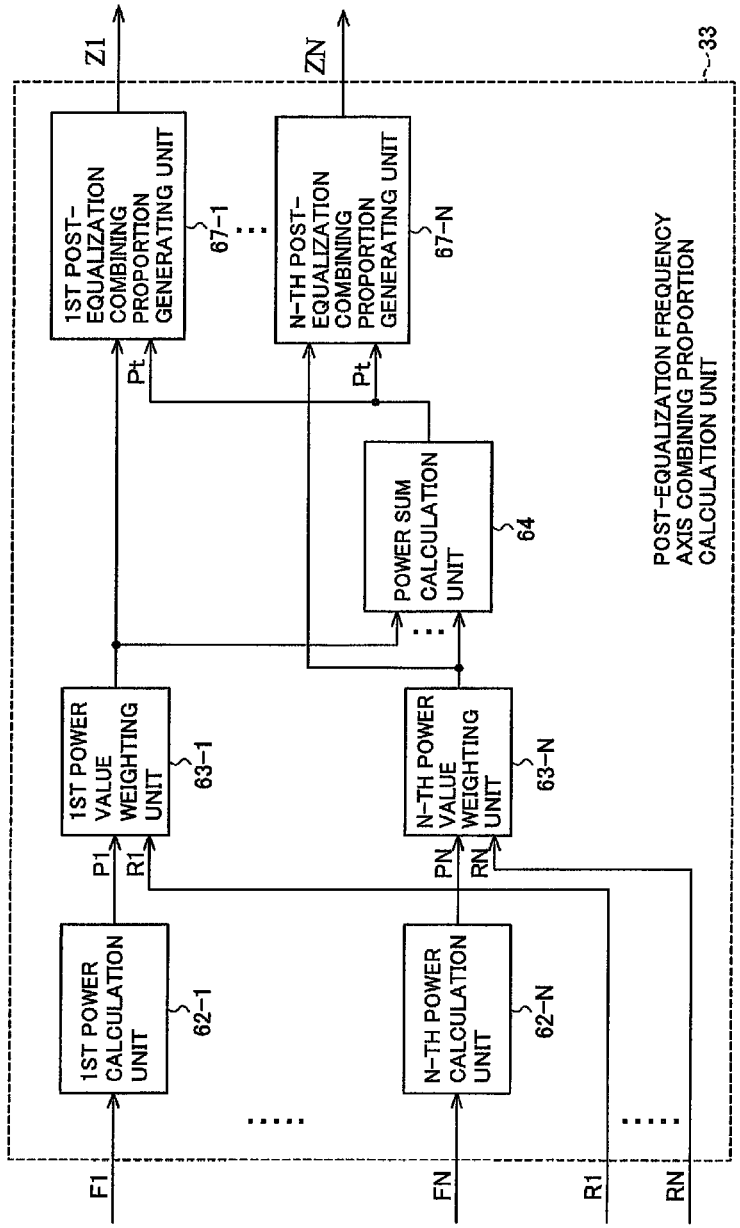

RECEPTION DEVICE AND METHOD

TECHNICAL FIELD

This invention relates to a reception device and method for a modulated signal carrying convolutionally coded transmitted data, more particularly to a reception device and method for a signal modulated by multivalue VSB (Vestigial Sideband) modulation, QPSK (Quadrature Phase Shift Keying) modulation, or multivalue QAM (Quadrature Amplitude Modulation).

BACKGROUND ART

To achieve desired transmission rates in digital transmission systems, techniques for improving system reliability are applied, such as increasing the transmittable quantity of information and reducing the error rate in reception by using both multivalue digital modulation techniques and error correction techniques, and reducing the required CNR (Carrier to Noise Power Ratio) by diversity combining techniques using multiple antennas.

For example, U.S. digital terrestrial broadcasting employs multivalue VSB modulation as its modulation system and recovers transmitted data by using, as error correction techniques, Viterbi decoding, which is effective in decoding trellis coded modulated signals, and Reed-Solomon decoding techniques for decoding Reed-Solomon codes (see, for example, Patent Reference 1, Patent Reference 2, and Patent Reference 3).

In general, a Viterbi decoder calculates branch metrics, indicating likelihoods, between the received signal constellation after phase and amplitude correction (also referred to as equalization below) and the uniquely determined signal constellation that depends on the modulation method. All possible surviving paths are found, the branch metrics of the paths are cumulatively summed, and the path with the smallest cumulative sum is selected. The state of the selected path is output as the Viterbi decoding result to recover the transmitted data.

As methods of reducing the error rate of Viterbi decoding results, techniques relating to the method of calculating the branch metrics have been proposed (see, for example, Patent Reference 4 and Patent Reference 5).

Methods for improving reception performance by diversity combining techniques are described in Patent Reference 6 and Non-Patent Reference 1.

PRIOR ART REFERENCES

Patent References

Patent Reference 1: U.S. Pat. No. 6,081,301 (pp. 1-3, FIGS. 1-3)
Patent Reference 2: U.S. Patent Application Publication No. 2003/0115540 (p. 2, FIG. 2)
Patent Reference 3: U.S. Patent Application Publication No. 2010/0142608 (p. 41, FIG. 45)
Patent Reference 4: U.S. Patent Application Publication No. 2001/0029596 (p. 7, FIG. 7)
Patent Reference 5: Japanese Patent No. 3344969 (p. 16, FIGS. 1 and 2)
Patent Reference 6: Japanese Patent No. 3377361 (p. 8, FIGS. 1 and 2)

Non-Patent References

Non-Patent Reference 1: Okumura et al., Ido Tsushin no Kiso (Fundamentals of Mobile Communication), IEICE of Japan (pp. 163-167)

SUMMARY OF THE INVENTION

Problems to be Solved by the Invention

Conventional Viterbi decoding techniques for signals onto which convolutionally coded or trellis coded data have been modulated by, for example, multivalue VSB (Vestigial Sideband) modulation, QPSK (Quadrature Phase Shift Keying), or multivalue QAM (Quadrature Amplitude Modulation) calculate Euclidean distances, which provide a likelihood metric on the signal constellation of the equalized signal and the uniquely determined signal constellation that depends on the modulation method, and calculate branch metrics on the basis of the results. Therefore, although the Euclidean distances between the signal constellations are considered in the branch metrics obtained by conventional reception devices, such factors as the average power of the noise included in the demodulated signal (also referred to below as the average noise power), the ratio of the desired signal power (e.g., the received signal power) to the noise power (also referred to below as the signal power to noise power ratio), the frequency characteristic of the transmission channel, and the effect of temporal fluctuations in the radio wave environment have not been considered.

When a transmitted signal is received while the receiver is moving, however, the power of the received signal varies greatly over time, so that the noise power ratio or the signal to noise power ratio also fluctuates over time. The temporal fluctuations in the radio wave environment and the frequency characteristic of the transmission channel also vary with the motion environment, motion speed, and other factors. Since the average noise power included in the demodulated signal, the absolute quantity of the signal to noise power ratio, and performance degrading factors caused by the temporal fluctuations in the radio wave environment and the frequency characteristic of the transmission channel are not considered in the Euclidean distances calculated from the equalized signal (also referred to below as the demodulated signal), there has been a problem in that the effects of the changes in these degradation factors cannot be suppressed in the decoding of the demodulated signal, and thus the error rate of the signal after the demodulated signal is decoded cannot be sufficiently reduced.

It is generally known that in the diversity combining of demodulated signals, such as signals obtained by multivalue VSB (Vestigial Side band) modulation, QPSK (Quadrature Phase Shift Keying) modulation, or multivalue QAM (Quadrature Amplitude Modulation) modulation, the greatest diversity gain is obtained when the combining ratio is determined from the envelope ratio of the received signals.

However, there has been a problem in that while the diversity gain is maximized when the combining ratio is calculated from the envelope ratio if the carrier power to noise power ratios (also referred to below as the C/N ratios) of the signals received at the individual antennas are identical, if the combining ratio is calculated based on the envelope ratio for signals with different C/N ratios, the error rate in the decoding result cannot be sufficiently reduced, but increases instead.

This invention addresses the above problems, with the object of improving reception performance by generating reliability information corresponding to the average noise power included in the demodulated signal, the absolute value of the signal to noise power ratio, temporal fluctuations in the radio wave environment and the frequency characteristic of the transmission channel, etc., and carrying out Viterbi decoding or diversity combining on the basis of the reliability information.

Means for Solving the Problem

To achieve the above object, a reception device in a first aspect of the invention is for receiving a transmitted signal modulated by convolutionally coded transmitted data, a given known signal being superimposed on the transmitted signal, and recovering the transmitted data from the received signal, comprising:

a frequency conversion means for converting the received signal to a signal in a given frequency band;

a Fourier transform means for performing a Fourier transform of the signal in the given frequency band and outputting a result;

a frequency-axis equalization means for receiving the output of the Fourier transform means and correcting, in a frequency domain, distortion suffered in a transmission channel by the signal received at the antenna, thereby performing equalization in the frequency domain;

an inverse Fourier transform means for performing an inverse Fourier transform on an output of the frequency-axis equalization means and outputting an equalized signal in a time domain;

a known signal generating means for generating the known signal superimposed on the transmitted signal;

a transmission channel estimation means for estimating the transmission channel of the received signal and outputting a Fourier transform of coefficients representing a frequency characteristic of the transmission channel;

a reliability information generating means for generating, from variations in a transmission channel amplitude characteristic of the output of the transmission channel estimation means in a transmission frequency band, reliability information representing reliability of the signal output from the inverse Fourier transform means; and a Viterbi decoding means for performing a Viterbi decoding process based on the output of the inverse Fourier transform means and the reliability information to recover the transmitted data; wherein the frequency-axis equalization means corrects the output of the Fourier transform means on a basis of the output of the transmission channel estimation means.

A reception device in a second aspect of the invention is for receiving a transmitted signal modulated by convolutionally coded transmitted data, a given known signal being superimposed on the transmitted signal, at first to N-th antennas (N being an integer equal to or greater than two) and recovering the transmitted data by diversity combining the received signals, comprising:

first to N-th frequency conversion means for respectively converting signals received at the first to N-th antennas to first to N-th signals in a given frequency band;

first to N-th Fourier transform means for respectively performing a Fourier transform of the first to N-th signals in the given frequency band;

a frequency-axis diversity combining means for diversity combining outputs of the first to N-th Fourier transform means and outputting a result of the combining;

an inverse Fourier transform means for performing an inverse Fourier transform on an output of the frequency-axis diversity combining means and outputting an equalized signal in a time domain;

a known signal generating means for generating the known signal superimposed on the transmitted signal;

first to N-th transmission channel estimation means for respectively receiving the first to N-th signals in the given frequency band and the known signal generated by the known signal generating means, respectively estimating transmission channels of the signals received at the first to N-th antennas, and outputting Fourier transforms of coefficients representing frequency characteristics of the transmission channels;

first to N-th reliability information generating means for respectively generating first to N-th reliability information representing reliabilities of the outputs of the first to N-th Fourier transform means, on a basis of outputs of the first to N-th transmission channel estimation means; and a frequency-axis combining proportion calculation means for calculating respective diversity combining proportions on a basis of the first to N-th reliability information and the outputs of the first to N-th transmission channel estimation means; wherein the frequency-axis diversity combining means combines the outputs of the first to N-th Fourier transform means according to outputs of the frequency-axis combining proportion calculation means.

A reception device in a third aspect of the invention is for receiving a transmitted signal modulated by convolutionally coded transmitted data, a given known signal being superimposed on the transmitted signal, at first to N-th antennas (N being an integer equal to or greater than two) and recovering the transmitted data by diversity combining the received signals, comprising:

first to N-th frequency conversion means for respectively converting signals received at the first to N-th antennas to first to N-th signals in a given frequency band;

first to N-th Fourier transform means for respectively performing a Fourier transform on the first to N-th signals in the given frequency band;

first to N-th frequency-axis equalization means for respectively receiving outputs of the first to N-th Fourier transform means and respectively performing corrections, in a frequency domain, for distortion suffered in transmission channels by the signals received at the first to N-th antennas, thereby performing equalization in the frequency domain;

a post-equalization frequency-axis diversity combining means for diversity combining outputs of the first to N-th frequency-axis equalization means and outputting a result of the combining;

an inverse Fourier transform means for performing an inverse Fourier transform on an output of the frequency-axis diversity combining means to output an equalized signal in a time domain;

a known signal generating means for generating the known signal superimposed on the transmitted signal;

first to N-th transmission channel estimation means for respectively receiving the first to N-th signals in the given frequency band and the known signal generated by the known signal generating means, respectively estimating transmission channels of the signals received at the first to N-th antennas, and outputting Fourier transforms of coefficients representing frequency characteristics of the transmission channels;

first to N-th reliability information generating means for respectively generating first to N-th reliability information representing reliabilities of the outputs of the first to N-th Fourier transform means, on a basis of outputs of the first to N-th transmission channel estimation means; and a post-equalization frequency-axis combining proportion calculation means for calculating respective diversity combining proportions on a basis of the first to N-th reliability information and the outputs of the first to N-th transmission channel estimation means; wherein the post-equalization frequency-axis diversity combining means combines the outputs of the first to N-th frequency-axis equalization means according to outputs of the post-equalization frequency-axis combining proportion calculation means; and the first to N-th frequency-axis equalization means also receive the outputs of the first to N-th transmission channel estimation means, and perform the corrections of the first to N-th Fourier transform means on a basis thereof.

Effects of the Invention

According to the first aspect of the invention, reliability information is generated for the equalized output from the filter coefficients obtained in the course of transmission channel estimation for the received signal; the reliability information can be used to improve error correction performance in various transmission channel environments, for example, by calculating branch metrics based on the reliability information and the Euclidean distances for Viterbi decoding, resulting in fewer errors in the transmitted data recovered at the receiving end.

According to the second and third aspects of the invention, reliability information is generated for the signal received at each receiving antenna from the filter coefficients obtained in the course of transmission channel estimation for the signal received at the antenna, and diversity combining is carried out on the basis of the reliability information, whereby the diversity gain in various transmission channel environments can be improved, resulting in fewer errors in the transmitted data recovered at the receiving end.

BRIEF DESCRIPTION OF THE DRAWINGS

FIG. 10 is a block diagram showing an exemplary structure of the post-equalization frequency axis combining proportion calculation unit 33 in FIG. 9.

MODE FOR CARRYING OUT THE INVENTION

First Embodiment

Figure 1:
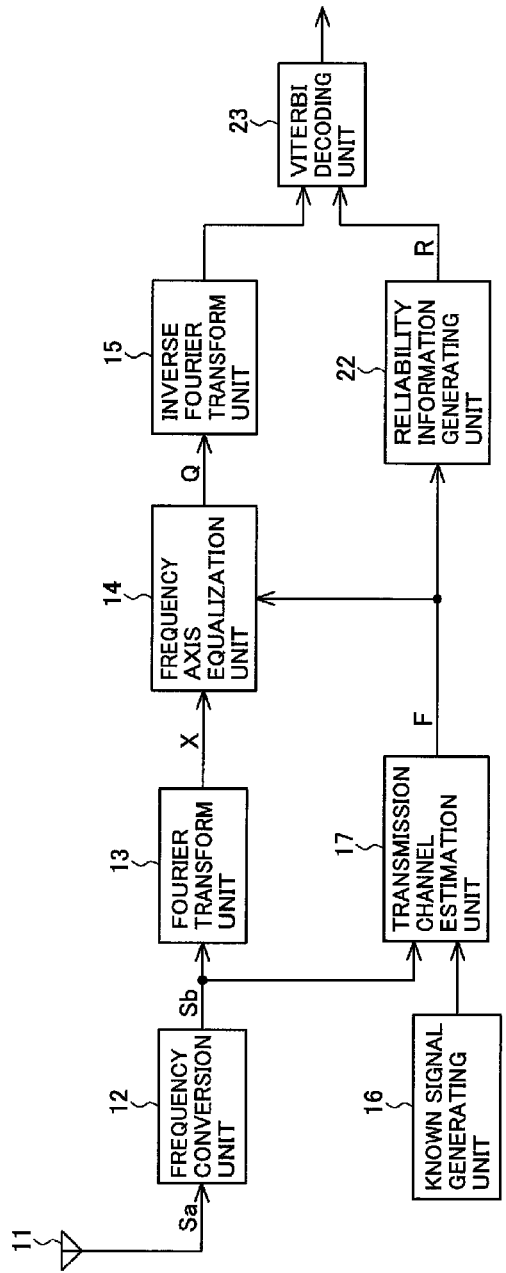
FIG. 1 is a block diagram showing the reception device in a first embodiment of the invention.

FIG. 1 is a block diagram showing a reception device according to a first embodiment of the invention. The reception device shown in FIG. 1 receives a transmitted signal obtained by modulation, e.g., multivalue VSB (Vestigial Sideband) modulation, QPSK (Quadrature Phase Shift Keying) modulation, or multivalue QAM (Quadrature Amplitude Modulation) modulation, with convolutionally coded transmitted data that have been convolutionally coded by a convolutional coder in a transmitting device (not shown), and recovers the transmitted data. The reception device has a frequency conversion unit 12 that receives a signal received by an antenna 11, a Fourier transform unit 13, a frequency axis equalization unit 14, an inverse Fourier transform unit 15, a known signal generating unit 16, a transmission channel estimation unit 17, a reliability information generating unit 22, and a Viterbi decoding unit 23.

The antenna 11 receives a transmitted signal, such as a multivalue VSB modulated signal, a QPSK modulated signal, or a multivalue QAM modulated signal, that has been modulated by convolutionally coded transmitted data.

The frequency conversion unit 12 converts the signal Sa received at the antenna 11 to a signal Sb in a given frequency band.

The Fourier transform unit 13 receives the signal (the signal in the given frequency band) output from the frequency conversion unit 12, and calculates and outputs a Fourier transform of the input signal Sb with a given number of points.

The frequency axis equalization unit 14 receives the output of the Fourier transform unit 13 and the output of the transmission channel estimation unit 17, and corrects, in the frequency domain (with respect to the frequency axis), distortion suffered by the signal received at the antenna 11 on the transmission channel, on the basis of a transmission channel estimation signal (the Fourier transform of the identification filter coefficients) output from the transmission channel estimation unit 17, thereby performing equalization of the output of the Fourier transform unit 13 in the frequency domain (frequency-axis equalization).

The inverse Fourier transform unit 15 receives the output Q of the frequency axis equalization unit 14, performs an inverse Fourier transform on the output Q of the frequency axis equalization unit 14, thereby converting it to an equalized signal in the time domain (on the time axis), and outputs the result. The output Q of the frequency axis equalization unit 14 is the equalized output of the received signal with distortion suffered in the transmission channel corrected. Conversion of a received signal onto the frequency axis and equalization of the so converted signal are known, so that a detailed description will be omitted here.

The Viterbi decoding unit 23 receives the output of the inverse Fourier transform unit 15 and the output R of the reliability information generating unit 22, described later, uses these inputs to perform Viterbi decoding to recover the transmitted data. In Viterbi decoding, the Viterbi decoding unit 23 uses the reliability information R output from the reliability information generating unit 22 as weighting coefficients for the branch metrics. That is, in decoding, it weights the branch metrics defined by the Euclidean distance itself or its square by the reliability information R, the weighting being performed so that the value of the weighted branch metric becomes smaller as the reliability increases, and selects surviving paths based on the weighted branch metrics.

The known signal generating unit 16 generates a known signal that is superimposed on the transmitted signal. For example, in the U.S. digital terrestrial broadcasting system, pseudo-random signals are embedded in the transmitted data series at fixed intervals, and since these are known signals, they can be generated by the reception device.

Figure 2:
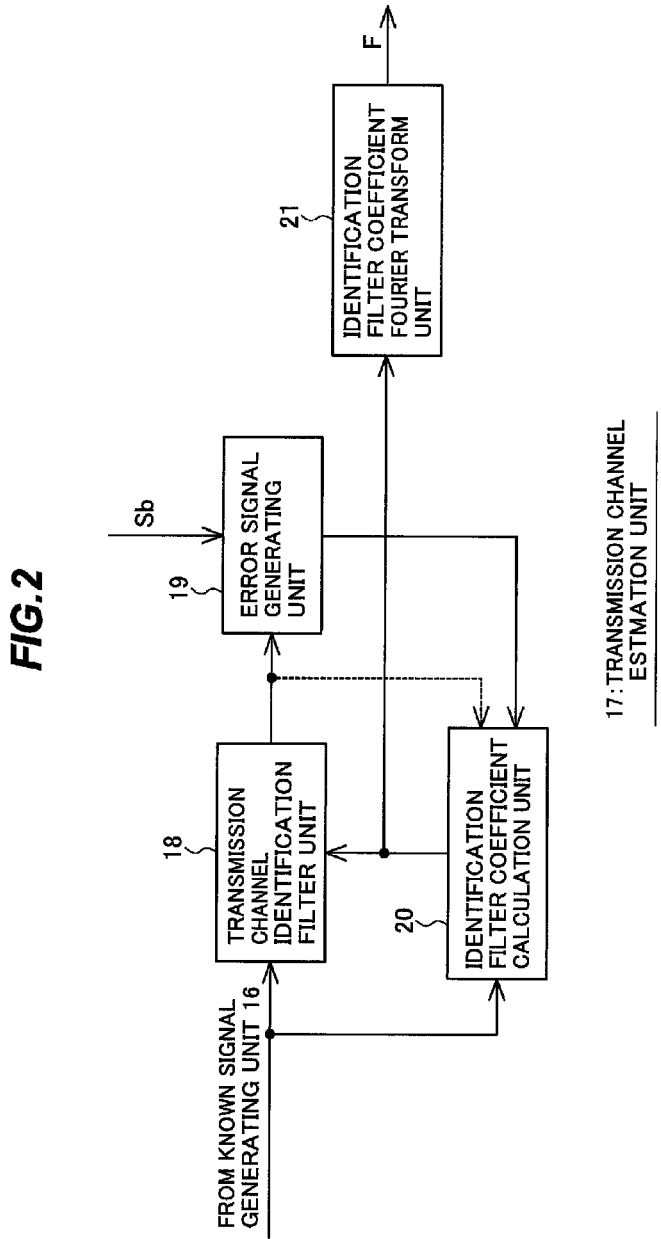
FIG. 2 is a block diagram showing an exemplary structure of the transmission channel estimation unit 17 in FIG. 1.

The transmission channel estimation unit 17 receives the output of the frequency conversion unit 12 and the output of the known signal generating unit 16, estimates the transmission channel (the transmission channel from the transmitting device to the antenna 11 of the reception device) of the received signal, and outputs a Fourier transform of coefficients representing the frequency characteristic of the transmission channel, and is configured as shown in FIG. 2.

The transmission channel estimation unit 17 shown in FIG. 2 includes a transmission channel identification filter 18, an error signal generating unit 19, an identification filter coefficient calculation unit 20, and an identification filter coefficient Fourier transform unit 21.

The transmission channel identification filter 18 receives the output of the identification filter coefficient calculation unit 20, to be described later, and the output of the known signal generating unit 16, filters the output of the known signal generating unit 16 by using the output of the identification filter coefficient calculation unit 20 as coefficients, and outputs the result.

The error signal generating unit 19 receives the signal Sb in the given frequency band output from the frequency conversion unit 12 and the output of the transmission channel identification filter 18, calculates the error in the output of the transmission channel identification filter 18 with respect to the signal Sb in the given frequency band, and outputs the result.

The identification filter coefficient calculation unit 20 determines the filter coefficients to be used in the transmission channel identification filter 18 to make the output of the error signal generating unit 19 become zero, that is, to make the output of the transmission channel identification filter 18 match signal Sb. When the output of the transmission channel identification filter 18 matches signal Sb, the combination of the transmission channel identification filter 18 and identification filter coefficient calculation unit 20 has the same transfer function as the transmission channel through which the received signal has passed, and the output of the identification filter coefficient calculation unit 20 represents the impulse response of the transmission channel.

In general, the identification filter coefficient calculation unit 20 updates and generates, from time to time, the filter coefficients of the transmission channel identification filter unit 18 by using, for example, the LMS (Least Mean Square Error) algorithm, CMA (Constant Modulus Algorithm), or another incremental updating algorithm to make the output of the error signal generating unit 19 become zero. In the LMS algorithm, the identification filter coefficient calculation unit 20 uses the known signal from the known signal generating unit 16 and the output of the error signal generating unit 19. In CMA, the identification filter coefficient calculation unit 20 uses not only the known signal from the known signal generating unit 16 and the output of the error signal generating unit 19 but also the output of the transmission channel identification filter 18, as indicated by the dotted line in FIG. 2. Any algorithm and means that make the output of the identification filter coefficient calculation unit 20 represent the impulse response of the transmission channel may be used in the invention, and as this is a known art, a detailed description will be omitted here.

The identification filter coefficient Fourier transform unit 21 receives the output of the identification filter coefficient calculation unit 20, performs a Fourier transform with a given number of points, and outputs the result. The output of the identification filter coefficient Fourier transform unit 21 represents the frequency characteristic of the transmission channel, that is, the estimate of the transmission channel at this time. The output of the identification filter coefficient Fourier transform unit 21 constitutes the output of the transmission channel estimation unit 17.

The frequency axis equalization unit 14 multiplies the transfer function representing the inverse characteristic of the transmission channel characteristic estimated by the transmission channel estimation unit 17 by the output X of the Fourier transform unit 13 to perform equalization.

The reliability information generating unit 22 receives the output of the transmission channel estimation unit 17, and generates and outputs the reliability information, which represents the reliability of the equalization result obtained by the frequency axis equalization unit 14 (accordingly, the reliability of the output of the inverse Fourier transform unit 15).

A specific exemplary structure of the reliability information generating unit 22 will now be described with reference to FIG. 3.

Figure 3:
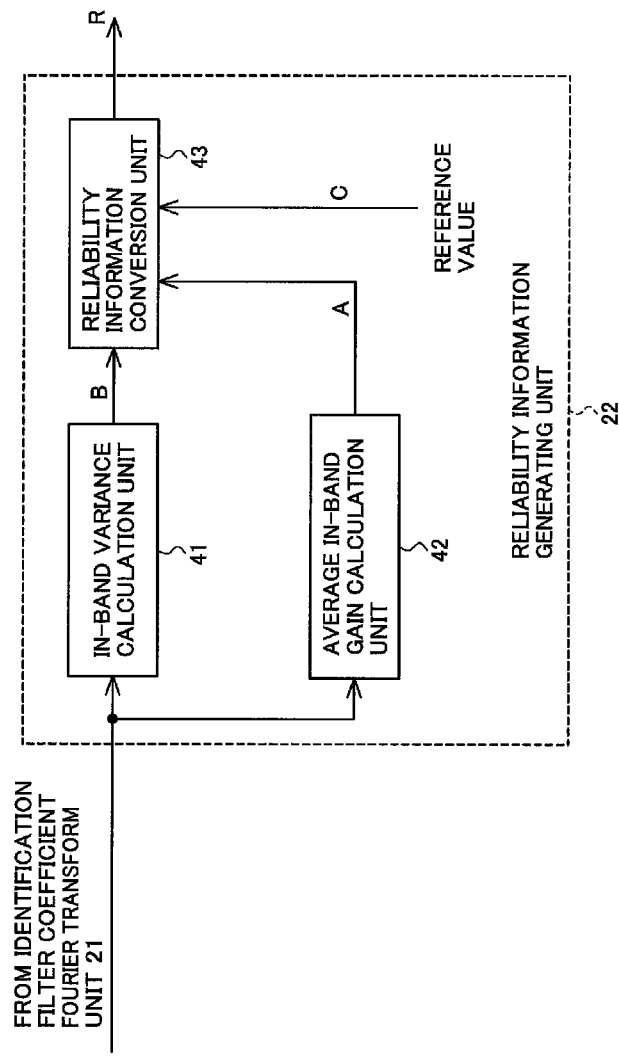
FIG. 3 is a block diagram showing an exemplary structure of the reliability information generating unit 22 in FIG. 1.

The reliability information generating unit 22 shown in FIG. 3 includes an in-band variance calculation unit 41, an average in-band gain calculation unit 42, and a reliability information conversion unit 43; the output of the reliability information conversion unit 43 is the output of the reliability information generating unit 22.

The input to the reliability information generating unit 22 (the Fourier transform result representing the frequency characteristic calculated by the identification filter coefficient Fourier transform unit 21) is supplied to the in-band variance calculation unit 41 and average in-band gain calculation unit 42.

The in-band variance calculation unit 41 receives the output of the transmission channel estimation unit 17 that is input to the reliability information generating unit 22, divides the output of the transmission channel estimation unit 17 into an in-band component in the transmission frequency band (signal band) and an out-of-band component, calculates the variation of the amplitude characteristic of the in-band component in the transmission frequency band as a variance value, and outputs the variance value. Specifically, the value obtained by subtracting the square of the mean value of the output of the identification filter coefficient Fourier transform unit 21 from the mean of the squared values of the output of the identification filter coefficient Fourier transform unit 21 is calculated as the variance.

The average in-band gain calculation unit 42 receives the output of the transmission channel estimation unit 17 input to the reliability information generating unit 22, calculates the average gain of the in-band component in the transmission frequency band (the average value of the transmission gain throughout the entire transmission frequency band), and outputs the result.

The reliability information conversion unit 43 receives the output of the in-band variance calculation unit 41 and the output of the average in-band gain calculation unit 42, generates reliability information R based thereon and on a given reference value, and outputs the result. The generation of the reliability information R could also be described as a process of converting the combination of the variance obtained by the in-band variance calculation unit 41 and the average gain obtained by the average in-band gain calculation unit 42 to reliability information based on the given reference value.

The signal conversion method used in the reliability information conversion unit 43 will now be described with reference to FIG. 4.

Figure 4:
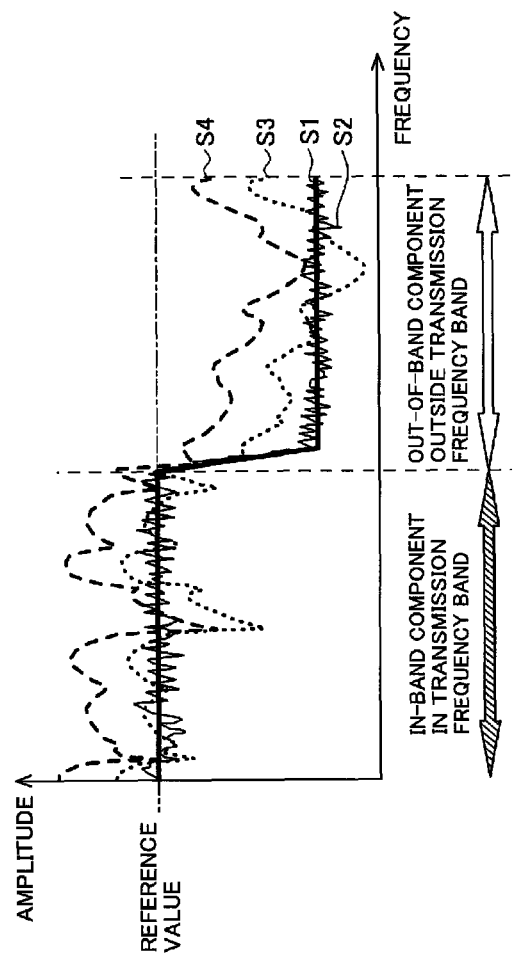
FIG. 4 is a schematic drawing showing an example of the output of the identification filter coefficient Fourier transform unit 21 in FIG. 2.

If the transmission channel is reflection-free and provides the desired C/N, the frequency characteristic represented by the Fourier transform result output from the identification filter coefficient Fourier transform unit 21 includes a constant amplitude throughout the transmission frequency band, as shown by the bold solid line in FIG. 4. Assuming that the amplitude value at this time is used as the above reference value, the output (average gain of the in-band component in the transmission frequency band) from the average in-band gain calculation unit 42 is constant and equal to the above reference value, and the output (variance value) from the in-band variance calculation unit 41 becomes zero.

On the other hand, in the similarly reflection-free case but with a small C/N value, the variations increase, as indicated by the thin solid line S2 in FIG. 4. In this case, the output (average gain of the in-band component in the transmission frequency band) from the average in-band gain calculation unit 42 has substantially the same level as the reference value, but the output (the variance value) from the in-band variance calculation unit 41 increases.

With a multipath transmission channel, the variance increases still further, as indicated by the bold dotted line S3 in FIG. 4, so that the output of the in-band variance calculation unit 41 increases still further.

With a multipath transmission channel, when the amplitude of the equalized output (the output Q of the frequency axis equalization unit 14) is small, the output of the average in-band gain calculation unit 42 becomes smaller than the reference value, as indicated by the bold dashed line S4, and the output of the in-band variance calculation unit 41 increases.

In the four examples above, the equalized output (the output Q of the frequency axis equalization unit 14) is thought to be most reliable in the case of the bold solid line S1, with reliability declining in order through the thin solid line S2, bold dotted line S3, and bold dashed line S4. The order of decline from the second case on down may change, however, depending on the magnitude relationships of the average gain and the variance of the in-band component in the transmission frequency band. In any case, reliability information can be generated for the equalized output on the basis of this information.

As an example, a positive real number R may be obtained as the reliability information from the formula (1) below, in which the output of the average in-band gain calculation unit 42 is A, the output of the in-band variance calculation unit 41 is B, the reference value is C, and a and b are given positive coefficients.

[Formula 1]

$$R = 1 + a(A-C) - bB \quad (1)$$

The conversion formula is not limited to formula (1); the formula only needs to reduce the reliability when the average gain A is smaller than the reference value C and reduce the reliability as the variance B increases; alternatively, the reliability information may be generated by using a conversion table instead of a conversion formula.

The reliability information may be generated from the variance B alone, without using the average gain. In this case, a conversion formula or conversion table that reduces the reliability as the variance B increases is used.

The reliability information generating unit 22 in the above example is configured to generate the reliability information by calculating the variation of the transmission channel amplitude characteristic in the transmission frequency band as a variance, but is not limited to a signal representing a variance; any signal corresponding to distortion in the transmission channel may be used.

Figure 5:
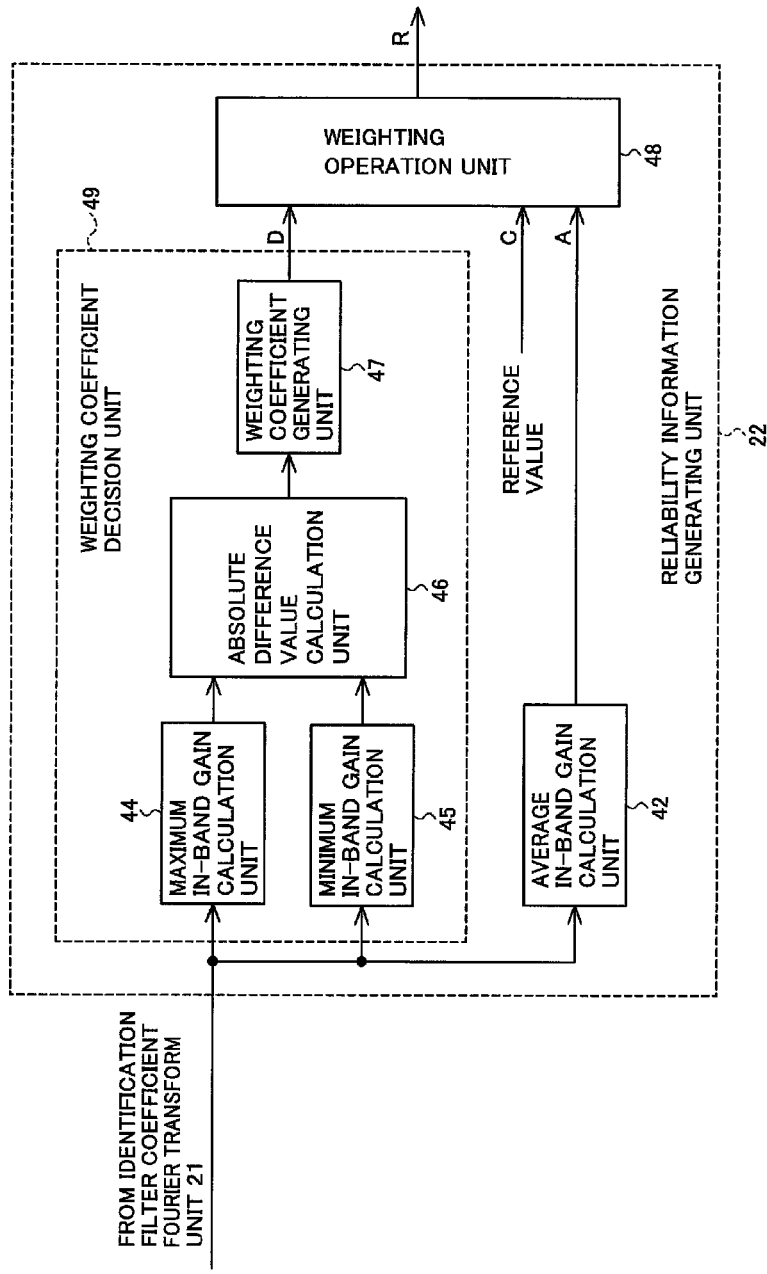
FIG. 5 is a block diagram showing another exemplary structure of the reliability information generating unit 22 in FIG. 1.

Another exemplary structure of the reliability information generating unit 22 is shown in FIG. 5.

The reliability information generating unit 22 shown in FIG. 5 has a maximum in-band gain calculation unit 44 that receives the output of the identification filter coefficient Fourier transform unit 21 input to the reliability information generating unit 22, a minimum in-band gain calculation unit 45 that also receives the output of the identification filter coefficient Fourier transform unit 21 input to the reliability information generating unit 22, an absolute difference value calculation unit 46, a weighting coefficient generating unit 47, an average in-band gain calculation unit 42, and a weighting operation unit 48. The output of the weighting operation unit 48 is the output of the reliability information generating unit 22. The average in-band gain calculation unit 42 is identical to the one shown in the exemplary structure in FIG. 3.

The maximum in-band gain calculation unit 44 divides the Fourier transform result (indicating the frequency characteristic) output from the identification filter coefficient Fourier transform unit 21 into an in-band component in the transmission frequency band (signal band) and an out-of-band component, and outputs the maximum value (maximum gain) of the amplitude characteristic of the in-band component in the transmission frequency band.

The minimum in-band gain calculation unit 45 divides the Fourier transform result (indicating the frequency characteristic) output from the identification filter coefficient Fourier transform unit 21 into an in-band component in the transmission frequency band (signal band) and an out-of-band component, and outputs the minimum value (minimum gain) of the amplitude characteristic of the in-band component in the transmission frequency band.

The absolute difference value calculation unit 46 calculates the absolute value of the difference between the output of the maximum in-band gain calculation unit 44 and the output of the minimum in-band gain calculation unit 45.

The weighting coefficient generating unit 47 receives the output of the absolute difference value calculation unit 46, converts the absolute value of the difference output from the absolute difference value calculation unit 46 to a corresponding positive coefficient, and outputs the result. For example, it sets the coefficient to 1 for an absolute difference value of 0, and outputs a value that gradually decreases from 1 as the absolute difference value increases.

The maximum in-band gain calculation unit 44, minimum in-band gain calculation unit 45, absolute difference value calculation unit 46, and weighting coefficient generating unit 47 constitute a weighting coefficient decision unit 49 that receives the output of the transmission channel estimation unit 17, that is, the transmission channel estimation result, and determines a weighting coefficient corresponding to the absolute value of the difference between the maximum gain and the minimum gain in the transmission frequency band.

The weighting operation unit 48 receives the output of the coefficient decision unit 49 and the output of the average in-band gain calculation unit 42, generates reliability information R based thereon and on a given reference value, and outputs the result. The generation of the reliability information R could also be described as a process of converting the combination of the weighting coefficient determined by the weighting coefficient decision unit 49 and the average gain obtained by the average in-band gain calculation unit 42 to reliability information based on the given reference value.

As an example, a positive real number R may be obtained as the reliability information from the formula (2) below, in which the output of the average in-band gain calculation unit 42 is A, the reference value is C, the output of the weighting coefficient generating unit 47 is D, and c and d are given positive coefficients.

[Formula 2]

$$R = 1 + c(A-C) \times dD \qquad (2)$$

The conversion formula is not limited to formula (2); the formula only needs to reduce the reliability when the average gain A is smaller than the reference value C and increase the reliability as the weighting coefficient D increases; alternatively, the reliability information may be generated by using a conversion table instead of a conversion formula. In addition, it is not necessary to determine the weighting coefficient D as above; it is only necessary for the reliability to decrease as the absolute value of the difference between the maximum in-band gain and minimum in-band gain increases.

Use of the reliability information generating unit 22 shown in FIG. 5 produces the effect that the reliability information can be obtained with relatively little circuitry or computation, because the reliability information is generated from the absolute value of the difference between the maximum in-band gain and minimum in-band gain in the transmission frequency band (signal band).

The signal R generated in the reliability information generating unit 22 is supplied as a branch metric weighting coefficient, together with the output of the inverse Fourier transform unit 15, to the Viterbi decoding unit 23, which uses them to perform Viterbi decoding and correct errors.

An exemplary structure of the Viterbi decoding unit 23 will now be described with reference to FIG. 6.

Figure 6:
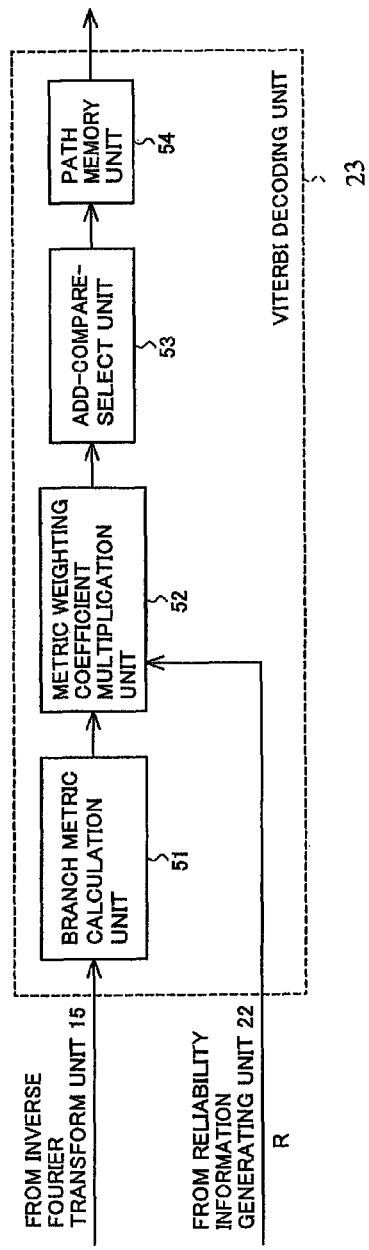
FIG. 6 is a block diagram showing an exemplary structure of the Viterbi decoding unit 23 in FIG. 1.

The Viterbi decoding unit 23 shown in FIG. 6 includes a branch metric calculation unit 51 that receives the output of the inverse Fourier transform unit 15, a metric weighting coefficient multiplication unit 52 that receives the output of the branch metric calculation unit 51 and the branch metric weighting coefficient output by the reliability information generating unit 22, an add-compare-select unit 53 that receives the output of the metric weighting coefficient multiplication unit 52, and a path memory unit 54 that receives the output of the add-compare-select unit 53. The output of the path memory unit 54 is the output of the Viterbi decoding unit 23.

In FIG. 6, the output of the inverse Fourier transform unit 15 is input to the branch metric calculation unit 51. The branch metric calculation unit 51 determines the Euclidean distances between the signal constellation of the equalized output and the signal constellation corresponding to each symbol uniquely determined by the modulation method of the received signal, and calculates, from the Euclidean distances, a given number of branch metrics determined by the structure of the convolutional coder in the transmitting device. The branch metrics calculated in the branch metric calculation unit 51 are input to the metric weighting coefficient multiplication unit 52.

The metric weighting coefficient multiplication unit 52 multiplies each of the branch metrics input from the branch metric calculation unit 51 by the reliability information, as a branch metric weighting coefficient, calculated in the reliability information generating unit 22.

The branch metrics (weighted branch metrics) that have been multiplied by the branch metric weighting coefficients are cumulatively added in the add-compare-select unit 53 so that multiple paths are calculated. The add-compare-select unit 53 also compares the calculated paths and selects a path with the smallest value.

The result of the cumulative addition of the branch metrics of the selected path is stored in the path memory unit 54 as a surviving path metric.

The path memory unit 54 stores the surviving path metric and outputs the information sequence corresponding to the path metric as the decoded signal.

As described above, according to the first embodiment, reliability information is generated for the equalized output from the filter coefficients obtained in the transmission channel identification process, the branch metrics determined from the Euclidean distance are weighted by the reliability information, and Viterbi decoding is performed by using the weighted branch metrics, so that error correction performance can be improved in various transmission channel environments, and accordingly errors in the transmitted data recovered at the receiving end can be reduced.

Second Embodiment

The first embodiment provides a structure in which reception performance is improved by using the reliability information in the Viterbi decoding unit 23; next an embodiment in which the reliability information is used in diversity combining will be described.

Figure 7:
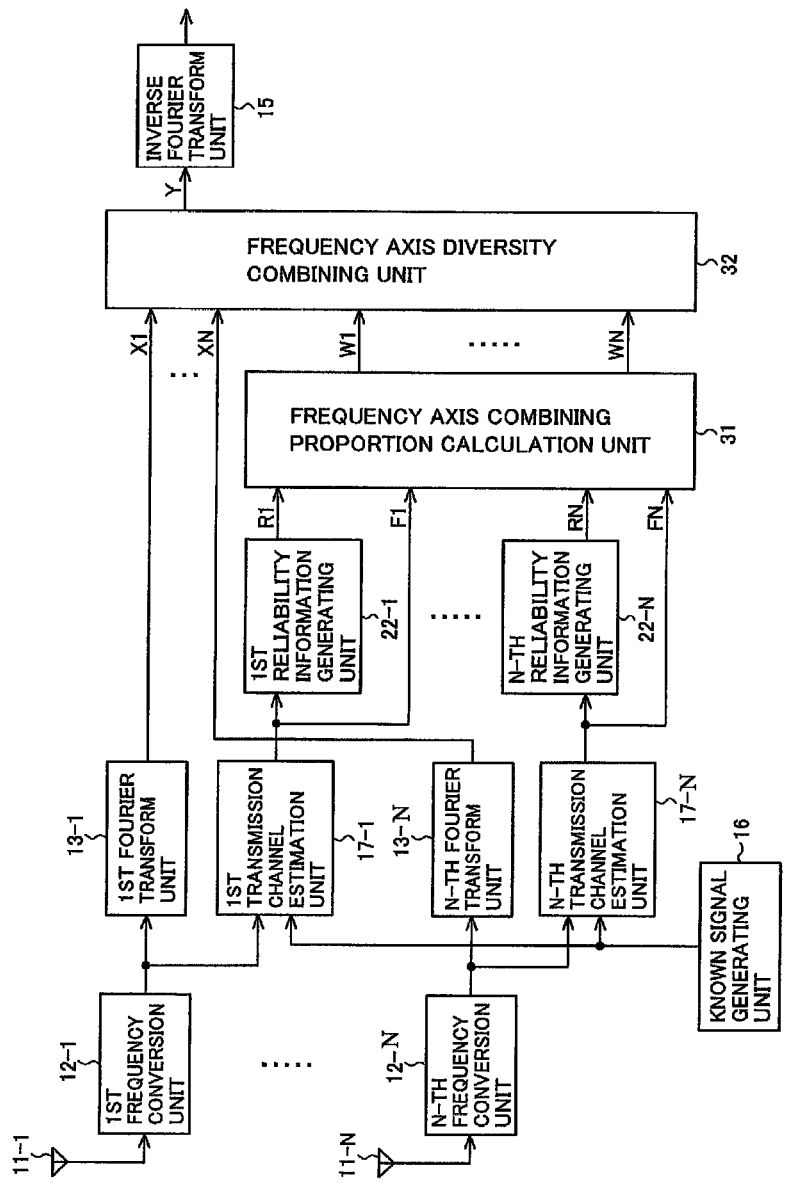
FIG. 7 is a block diagram showing the reception device in a second embodiment of the invention.

FIG. 7 is a block diagram showing a reception device according to a second embodiment of the invention.

FIG. 7 shows a case in which multiple antennas, specifically first to N-th antennas 11-1 to 11-N (N being an integer equal to or greater than 2), are used to receive signals which are diversity combined, then decoded.

The reception device shown in FIG. 7 includes first to N-th frequency conversion units 12-1 to 12-N, first to N-th Fourier transform units 13-1 to 13-N, a known signal generating unit 16, first to N-th transmission channel estimation units 17-1 to 17-N, first to N-th reliability information generating units 22-1 to 22-N, a frequency axis combining proportion calculation unit 31, a frequency axis diversity combining unit 32, and an inverse Fourier transform unit 15. The output of the inverse Fourier transform unit 15 is the decoded output.

The first to N-th frequency conversion units 12-1 to 12-N are respectively provided in association with the first to N-th antennas 11-1 to 11-N, and respectively convert signals (the first to N-th received signals) Sa1 to SaN received at the first to N-th antennas to signals S1 to SbN in a given frequency band. In other words, the n-th frequency conversion unit 12-*n* (n being one of 1 to N) converts the n-th received signal San obtained by reception at the associated n-th antenna 11-*n* to a signal Sbn in the given frequency band. In structure and operation, each of the first to N-th frequency conversion units 12-1 to 12-N is identical to the frequency conversion unit 12 shown in the first embodiment.

The first to N-th Fourier transform units 13-1 to 13-N are respectively provided in association with the first to N-th frequency conversion units 12-1 to 12-N, respectively receive the outputs Sb1 to SbN of the first to N-th frequency conversion units 12-1 to 12-N, perform Fourier transforms on them, and output the results. In other words, the n-th Fourier transform unit 13-*n* receives the output Sbn of the associated n-th Fourier transform unit 13-*n*, performs a Fourier transform, and outputs the result. In structure and operation, each the first to N-th Fourier transform units 13-1 to 13-N is identical to the Fourier transform unit 13 shown in the first embodiment.

The known signal generating unit 16, like the known signal generating unit 16 shown in the first embodiment, generates a known signal superimposed on the transmitted signal.

The first to N-th transmission channel estimation units 17-1 to 17-N are respectively provided in association with the first to N-th frequency conversion units 12-1 to 12-N, respectively receive the signals Sb1 to SbN in the given frequency band output from the first to N-th frequency conversion units 12-1 to 12-N, and respectively estimate the transmission channels of the signals received by the first to N-th frequency conversion units 12-1 to 12-N.

In structure and operation, each of the first to N-th transmission channel estimation units 17-1 to 17-N is identical to the transmission channel estimation unit 17 described with reference to FIG. 2 in relation to the first embodiment; each of the first to N-th transmission channel estimation units 17-1 to 17-N includes a transmission channel identification filter 18, an error signal generating unit 19, an identification filter coefficient calculation unit 20, and an identification filter coefficient Fourier transform unit 21.

The transmission channel identification filter 18 in transmission channel estimation unit 17-$n$ receives the output of the known signal generating unit 16 input to transmission channel estimation unit 17-$n$ and the output of the identification filter coefficient calculation unit 20 in the same transmission channel estimation unit 17-$n$, filters the output of the known signal generating unit 16 with the coefficients output by the identification filter coefficient calculation unit 20, and outputs the result.

The error signal generating unit 19 receives the output of the associated frequency conversion unit 12-$n$ input to transmission channel estimation unit 17-$n$ and the output of the transmission channel identification filter 18 (in the same transmission channel estimation unit 17-$n$), and outputs a signal indicating the error of the latter with respect to the former.

When the LMS algorithm is used, the identification filter coefficient calculation unit 20 receives the known signal from the known signal generating unit 16 and the output of the error signal generating unit 19 (in the same transmission channel estimation unit 17-$n$), and calculates the filter coefficients to be used in the transmission channel estimation unit 17 to make the output of the error signal generating unit 19 become zero. When the CMA is used, the identification filter coefficient calculation unit 20 uses not only the known signal from the known signal generating unit 16 and the output of the error signal generating unit 19 (he same transmission channel estimation unit 17-$n$) but also the output of the transmission channel identification filter 18 (in the same transmission channel estimation unit 17-$n$), as indicated by the dotted line in FIG. 2.

The identification filter coefficient Fourier transform unit 21 receives the output of the identification filter coefficient calculation unit 20, performs a Fourier transform thereon, and outputs the result.

The output of the identification filter coefficient Fourier transform unit 21 in each transmission channel estimation unit 17-$n$ is the output of the transmission channel estimation unit 17-$n$.

The first to N-th reliability information generating units 22-1 to 22-N are respectively provided in association with the first to N-th transmission channel estimation units 17-1 to 17-N and also in association with the first to N-th Fourier transform units 13-1 to 13-N, respectively receive the outputs of the first to N-th transmission channel estimation units 17-1 to 17-N, and respectively generate first to N-th reliability information R1 to RN representing the reliabilities of the outputs X1 to XN of the first to N-th Fourier transform units 13-1 to 13-N. In other words, the n-th reliability information generating unit 22-$n$ receives the output of the associated n-th transmission channel estimation unit 17-$n$ and generates the n-th reliability information Rn representing the reliability of the output Xn of the n-th Fourier transform unit 13-$n$. Like the reliability information generating unit 22 described in the first embodiment, each of the first to N-th reliability information generating units 22-1 to 22-N may be structured as shown in FIG. 3 or as shown in FIG. 5.

When structured as shown in FIG. 3, the in-band variance calculation unit 41 and the average in-band gain calculation unit 42 in each of the first to N-th reliability information generating units 22-1 to 22-N, that is, the n-th reliability information generating unit 22-$n$, calculates the variance and average gain of the in-band signal in the transmission channel estimation result Fn input from the associated transmission channel estimation unit 17-$n$ to the reliability information generating unit 22-$n$; the reliability information conversion unit 43 receives the output of the in-band variance calculation unit 41 and the output of the average in-band gain calculation unit 42 and generates reliability information Rn.

When structured as shown in FIG. 5, the weighting coefficient decision unit 49 and the average in-band gain calculation unit 42 in each of the first to N-th reliability information generating units 22-1 to 22-N, that is, in the n-th reliability information generating unit 22-$n$, determines a weighting coefficient D based on the transmission channel estimation result Fn input from the associated transmission channel estimation unit 17-$n$ to the reliability information generating unit 22-$n$ and calculates the average gain A of the in-band signal in the transmission frequency band, and the weighting operation unit 48 receives the output D of the weighting coefficient generating unit 47 and the output A of the average in-band gain calculation unit 42 and generates the reliability information Rn therefrom.

The frequency axis combining proportion calculation unit 31 calculates diversity combining proportions W1 to WN based on the outputs of the first to N-th reliability information generating units 22-1 to 22-N and the outputs of the first to N-th transmission channel estimation units 17-1 to 17-N. Specifically, it receives the reliability information R1 to RN corresponding to the first to N-th antennas 11-1 to 11-N and the results F1 to FN of the Fourier transforms of the identification filter coefficients output from the first to N-th transmission channel estimation units 17-1 to 17-N, and from them it calculates and outputs the combining proportions (diversity combining proportions) W1 to WN for the outputs X1 to XN of the first to N-th Fourier transform units 13-1 to 13-N.

An exemplary structure of the frequency axis combining proportion calculation unit 31 will now be described with reference to FIG. 8. The frequency axis combining proportion calculation unit 31 shown in FIG. 8 includes first to N-th complex conjugation units 61-1 to 61-N, first to N-th power calculation units 62-1 to 62-N, first to N-th power value weighting units 63-1 to 63-N, a power sum calculation unit 64, and first to N-th combining proportion generating units 65-1 to 65-N; the outputs of the first to N-th combining proportion generating units 65-1 to 65-N respectively represent the combining proportions W1 to WN for the outputs of the first to N-th Fourier transform units 13-1 to 13-N.

The output F1 of the first transmission channel estimation unit 17-1 is input to the first complex conjugation unit 61-1 and the first power calculation unit 62-1. The first complex conjugation unit 61-1 generates the complex conjugate signal H1 of the output F1 of the first transmission channel estimation unit 17-1. The first power calculation unit 62-1 calculates a value P1 equal to the square of the amplitude of the output of the first transmission channel estimation unit 17-1 as a power value and outputs it.

The first power value weighting unit 63-1 weights the output P1 of the first power calculation unit 62-1 according to the first reliability information R1 output by the first reliability information generating unit 22-1, that is, it performs an operation that takes the product of the two quantities, and outputs the result. This weighting is performed by taking the product (P1×R1) of the output P1 of the first power calculation unit 62-1 and the first reliability signal information R1.

The second to N-th complex conjugation units 61-2 to 61-N, the second to N-th power calculation units 62-2 to 62-N, and the second to N-th power value weighting units 63-2 to 63-N respectively operate in the same way as the first complex conjugation unit 61-1, the first power calculation unit 62-1, and the first power value weighting unit 63-1.

Accordingly, the first to N-th complex conjugation units 61-1 to 61-N respectively receive, as inputs, the outputs F1 to FN of the first to N-th transmission channel estimation units 17-1 to 17-N, convert the inputs to their complex conjugate signals H1 to HN, and output them. The first to N-th power calculation units 62-1 to 62-N respectively receive the outputs F1 to FN of the first to N-th transmission channel estimation units 17-1 to 17-N, calculate the squares of their amplitudes, and output them as power values P1 to PN.

The first to N-th power value weighting units 63-1 to 63-N respectively weight the outputs P1 to PN of the first to N-th power calculation units 62-1 to 62-N with, respectively, the first to N-th reliability information R1 to RN, and output the results.

The power sum calculation unit 64 calculates and outputs the sum Pt of the outputs (R1×P1) to (RN×PN) of the first to N-th power value weighting units 63-1 to 63-N. Assuming that j is a variable ranging from 1 to N, the operation for determining the sum Pt of the power values in the power sum calculation unit 64 is represented by the following Formula (3).

[Formula 3]

$$Pt = \sum_{j=1}^{N} RjPj \qquad (3)$$

The output Pt of the power sum calculation unit 64 is input to the first to N-th combining proportion generating units 65-1 to 65-N.

From the output H1 of the first complex conjugation unit 61-1, the first reliability information output R1, and the output Pt of the power sum calculation unit 64, the first combining proportion generating unit 65-1 generates and outputs the combining proportion W1 for the output X1 of the first Fourier transform unit 13-1.

In structure and operation, each of the second to N-th combining proportion generating units 65-2 to 65-N is identical to the first combining proportion generating unit 65-1.

Accordingly, from the outputs H1 to HN of the first to N-th complex conjugation units 61-1 to 61-N, the first to N-th reliability information R1 to RN, and the output Pt of the power sum calculation unit 64, the first to N-th combining proportion generating units 65-1 to 65-N respectively calculate and output the diversity combining proportions W1 to WN for the outputs X1 to XN of the first to N-th Fourier transform units 13-1 to 13-N.

Figure 8:
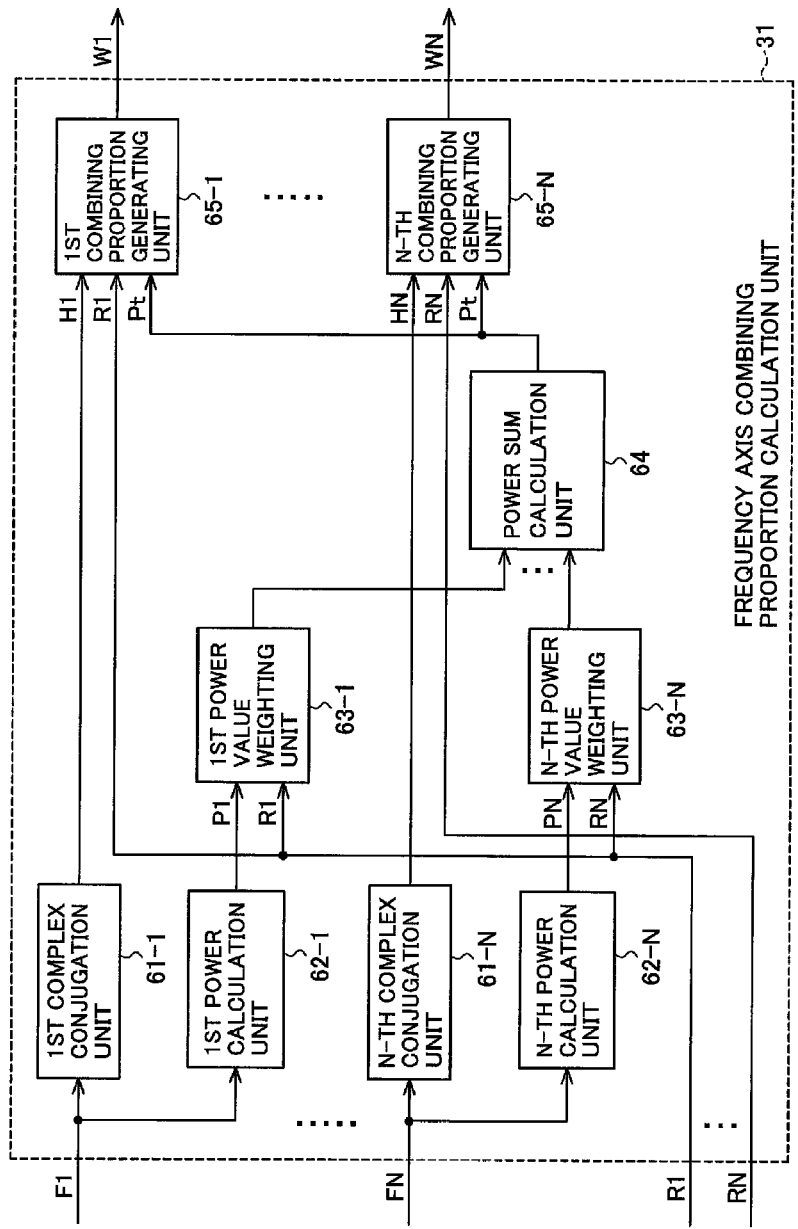
FIG. 8 is a block diagram showing an exemplary structure of the frequency axis combining proportion calculation unit 31 in FIG. 7.

The diversity combining proportion obtained by the exemplary structure in FIG. 8 is given by, for example, the following formula (4). If i is an arbitrary integer from 1 to N, formula (4) represents the combining proportion Wi for the output of the i-th Fourier transform unit 13-*i*, Hi represents the output of the i-th complex conjugation unit 61-*i*, and Ri represents the i-th reliability information.

[Formula 4]

$$Wi = \frac{RiHi}{Pt} \qquad (4)$$

By using the combining proportion determined by Formula (4), the output of each Fourier transform unit (13-*i*) is weighted in proportion to the product of the complex conjugate (Hi) calculated by the corresponding i-th complex conjugation unit (61-*i*) and the reliability (Ri) generated by the corresponding reliability information generating unit (22-*i*) before being combined.

The method of calculating the combining proportions in the frequency axis combining proportion calculation unit 31 is not limited to the above method; it need only vary the combining proportions according to the magnitude of the reliability information and increase the combining proportion as the reliability of the output of the Fourier transform unit increases.

The frequency axis diversity combining unit 32 receives the outputs W1 to WN of the frequency axis combining proportion calculation unit 31 and the outputs X1 to XN of the first to N-th Fourier transform units 13-1 to 13-N, combines the outputs X1 to XN of the first to N-th Fourier transform units 13-1 to 13-N according to the outputs W1 to WN of the frequency axis combining proportion calculation unit 31, and outputs the result. For example, the outputs X1 to XN of the Fourier transform units 13-1 to 13-N are weighted by the combining proportions W1 to WN and summed as shown in the following formula (5). In formula (5), Xi represents the output of Fourier transform unit 13-*i* and Y represents the combined output.

[Formula 5]

$$Y = \sum_{i=1}^{N} WiXi \qquad (5)$$

Since reliability information is generated as above, based on the transmission channel identification filter coefficients obtained in the transmission channel estimation process, and is used in diversity combining of the signals received by the receiving antennas, the diversity gain is improved in various transmission channel environments and errors in the transmitted data recovered at the receiving end can be reduced.

Third Embodiment

The second embodiment provides a structure in which reliability information is used for diversity combining of the outputs of the first to N-th Fourier transform units 13-1 to 13-N; next an embodiment with a structure in which the results of equalization performed in the frequency domain are diversity combined will be described.

Figure 9:
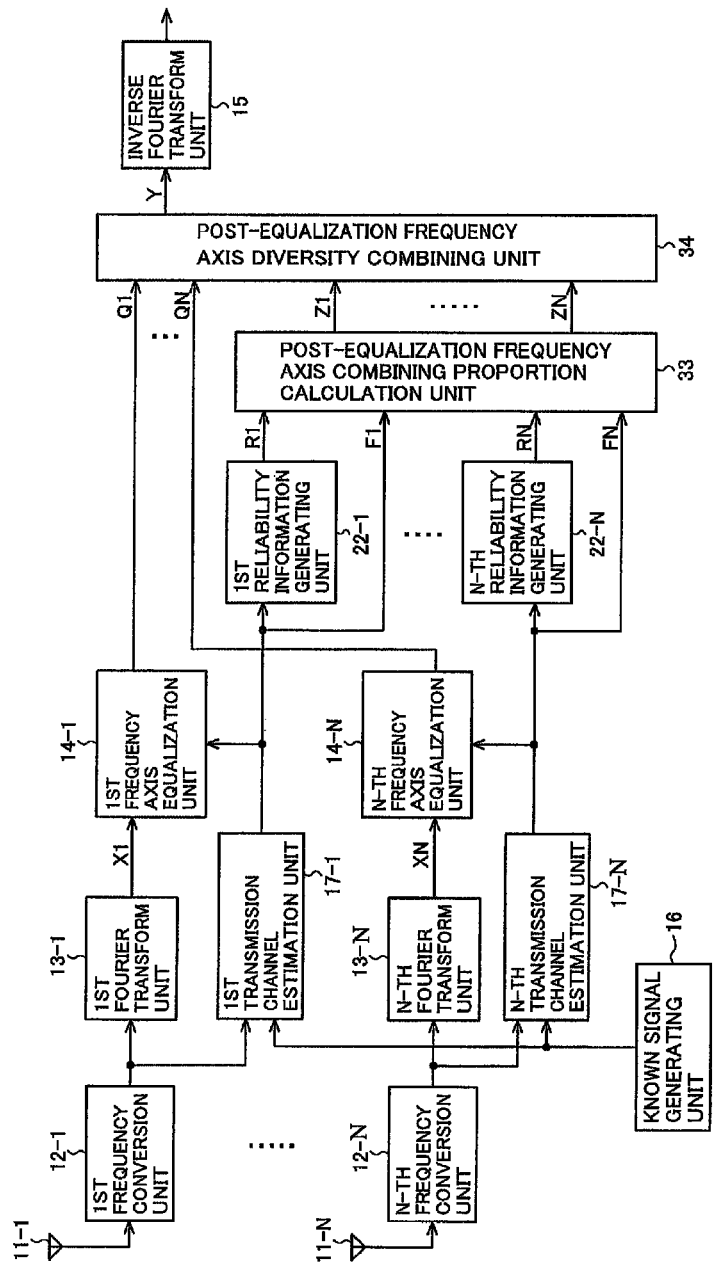
FIG. 9 is a block diagram showing the reception device in a third embodiment of the invention.

FIG. 9 is a block diagram showing a reception device according to a third embodiment of the invention. The reception device shown in FIG. 9 is generally the same as the reception device in the first embodiment or the second embodiment, but differs in that first to N-th frequency axis equalization units 14-1 to 14-N are added, and the frequency axis combining proportion calculation unit 31 and frequency axis diversity combining unit 32 in the second embodiment are replaced by a post-equalization frequency axis combining proportion calculation unit 33 and a post-equalization frequency axis diversity combining unit 34.

In structure and operation, the first to N-th Fourier transform units 13-1 to 13-N, the known signal generating unit 16, the first to N-th transmission channel estimation units 17-1 to 17-N, and the first to N-th reliability information generating units 22-1 to 22-N are identical to the elements with the same reference characters shown in the second embodiment.

The first to N-th frequency axis equalization units 14-1 to 14-N are respectively provided in association with the first to N-th Fourier transform units 13-1 to 13-N and also in association with the first to N-th transmission channel estimation units 17-1 to 17-N, respectively receive the outputs X1 to XN of the first to N-th Fourier transform units 13-1 to 13-N and the outputs F1 to FN of the first to N-th transmission channel estimation units 17-1 to 17-N, and respectively use the transmission channel estimation signals (Fourier transforms of the identification filter coefficients) F1 to FN output from the first to N-th transmission channel estimation units 17-1 to 17-N, to correct the distortion suffered in the transmission channels by the signals received at the first to N-th antennas 11-1 to 11-N in the frequency domain, thereby performing respective corrections in the frequency domain on the outputs X1 to XN of the first to N-th Fourier transform units 13-1 to 13-N. Specifically, the outputs X1 to XN of the first to N-th Fourier transform units 13-1 to 13-N are respectively multiplied by transfer functions representing the inverse characteristics of the transmission channels estimated by the first to N-th transmission channel estimation units 17-1 to 17-N, thereby performing equalization. In other words, the n-th frequency axis equalization unit 14-$n$ equalizes the output Xn of Fourier transform unit 13-$n$, based on the transmission channel estimation signal (Fourier transform of the identification filter coefficients) Fn output from the n-th transmission channel estimation unit 17-$n$, thereby correcting, in the frequency domain, the distortion which the signal received at the n-th antenna 11-$n$ suffered in the transmission channel, and outputs the result. Specifically, it performs equalization by multiplying the output Xn of the n-th Fourier transform unit 13-$n$ by the transfer function representing the inverse characteristic of the transmission channel estimated in the n-th transmission channel estimation unit 17-$n$.

In structure and operation, each of the first to N-th frequency axis equalization units 14-1 to 14-N is identical to the frequency axis equalization unit 14 shown in the first embodiment.

The post-equalization frequency axis diversity combining unit 34 receives the output of the post-equalization frequency axis combining proportion calculation unit 33, described later, and the outputs Q1 to QN of the first to N-th frequency axis equalization units 14-1 to 14-N, combines the outputs Q1 to QN of the first to N-th frequency axis equalization units 14-1 to 14-N according to the output of the post-equalization frequency axis combining proportion calculation unit 33, described later, and outputs the result.

The inverse Fourier transform unit 15 receives the output of the post-equalization frequency axis diversity combining unit 34, performs an inverse Fourier transform on the output of the post-equalization frequency axis diversity combining unit 34, thereby converting it to an equalized signal in the time domain, and outputs the result. In structure and operation, the inverse Fourier transform unit 15 is identical to the inverse Fourier transform unit 15 in the second embodiment.

The post-equalization frequency axis combining proportion calculation unit 33 calculates the diversity combining proportions Z1 to ZN for the signals after frequency-axis equalization based on the outputs R1 to RN of the first to N-th reliability information generating units 22-1 to 22-N and the outputs F1 to FN of the first to N-th transmission channel estimation units 17-1 to 17-N.

An exemplary structure of the post-equalization frequency axis combining proportion calculation unit 33 will be described with reference to FIG. 10. The post-equalization frequency axis combining proportion calculation unit 33 shown in FIG. 10 includes power calculation units 62-1 to 62-N, power value weighting units 63-1 to 63-N, and a power sum calculation unit 64, which are similar to the elements shown in FIG. 8, as well as first to N-th post-equalization combining proportion generating units 67-1 to 67-N; the outputs of the first to N-th post-equalization combining proportion generating units 67-1 to 67-N respectively represent the combining proportions Z1 to ZN for the outputs of the first to N-th frequency axis equalization units 14-1 to 14-N.

In FIG. 10, differing from FIG. 8, complex conjugation units 61-1 to 61-N are not provided, and the first to N-th post-equalization combining proportion generating units 67-1 to 67-N respectively generate post-equalization combining proportions based on the outputs of the first to N-th power value weighting units 63-1 to 63-N.

The operation of the power calculation units 62-1 to 62-N, power value weighting units 63-1 to 63-N, and power sum calculation unit 64 is identical to the operation of the elements shown in FIG. 8.

From the outputs of the first power value weighting unit 63-1 and the power sum calculation unit 64, the first post-equalization combining proportion generating unit 67-1 generates and outputs the combining proportion W1 for the output of the first frequency axis equalization unit 14-1.

In structure and operation, the second to N-th post-equalization combining proportion generating units 67-2 to 67-N are identical to the first post-equalization combining proportion generating unit 67-1.

Accordingly, from the outputs of the first to N-th power value weighting units 63-1 to 63-N and the output Pt of the power sum calculation unit, the first to N-th post-equalization combining proportion generating units 67-1 to 67-N respectively calculate and output the diversity combining proportions for the outputs Q1 to QN of the first to N-th frequency axis equalization units 14-1 to 14-N.

The diversity combining proportions obtained in the exemplary structure in FIG. 10 are given by the following formula (6). Formula (6) represents the combining proportion Zi for the output of the i-th frequency axis equalization unit 14-$i$, Pi represents the output of the i-th power calculation unit 62-$i$, and Ri represents the i-th reliability information.

[Formula 6]

$$Zi = \frac{RiPi}{Pt} \tag{6}$$

The method of calculating combining proportions in the post-equalization frequency axis combining proportion calculation unit 33 is not limited to the above method; it need only vary the combining proportion according to the magnitude of the reliability information and increase the combining proportion as the reliability of the output of the Fourier transform unit increases.

The post-equalization frequency axis diversity combining unit 34 weights the outputs of the first to N-th frequency axis equalization units based on the combining proportions obtained in the post-equalization frequency axis combining proportion calculation unit 33 and sums them as shown by the following formula (7). In formula (7), Qi represents the output of the i-th frequency axis equalization unit 14-*i* and Y represents the combined output.

[Formula 7]

$$Y = \sum_{i=1}^{N} ZiQi \quad (7)$$

Since reliability information is generated as above, based on the transmission channel identification filter coefficients obtained in the transmission channel estimation process, and the signals received at the receiving antennas are diversity combined by using this information, the diversity gain is improved in various transmission channel environments, and errors in the transmitted data recovered at the receiving end can be reduced.

The invention has been described above in relation to a device, but the method carried out by the device also forms part of the invention.

REFERENCE CHARACTERS

11, 11-1, 11-N antenna, 12, 12-1 to 12-N frequency conversion unit, 13, 13-1 to 13-N Fourier transform unit, 14, 14-1 to 14-N frequency axis equalization unit, 15 inverse Fourier transform unit, 16 known signal generating unit, 17, 17-1 to 17-N transmission channel estimation unit, 18, 18-1 to 18-N transmission channel identification filter, 19, 19-1 to 19-N error signal generating unit, 20, 20-1 to 20-N identification filter coefficient calculation unit, 21, 21-1 to 21-N, identification filter coefficient Fourier transform unit, 22, 22-1 to 22-N reliability information generating unit, 23 Viterbi decoding unit, 31 frequency axis combining proportion calculation unit, 32 frequency axis diversity combining unit, 33 post-equalization frequency axis combining proportion calculation unit, 34 post-equalization frequency axis diversity combining unit, 41 in-band variance calculation unit, 42 average in-band gain calculation unit, 43 reliability information conversion unit, 44 maximum in-band gain calculation unit, 45 minimum in-band gain calculation unit, 46 absolute difference value calculation unit, 47 weighting coefficient generating unit, 48 weighting operation unit, 49 weighting coefficient decision unit, 51 branch metric calculation unit, 52 metric weighting coefficient multiplication unit, 53 add-compare-select unit, 54 path memory unit, 61-1 to 61-N complex conjugation unit, 62-1 to 62-N power calculation unit, 63-1 to 63-N power value weighting unit, 64 power sum calculation unit, 65-1 to 65-N, combining proportion generating unit, 67-1 to 67-N post-equalization combining proportion generating unit.

What is claimed is:

1. A reception device for receiving a transmitted signal modulated by convolutionally coded transmitted data, a given known signal being superimposed on the transmitted signal, and recovering the transmitted data from the received signal, comprising:

a frequency conversion unit configured to convert the received signal to a signal in a given frequency band;

a Fourier transform configured to perform a Fourier transform of the signal in the given frequency band and output a result;

a frequency-axis equalization unit configured to receive the output of the Fourier transform unit and correct, in a frequency domain, distortion suffered in a transmission channel by the received signal, thereby performing equalization in the frequency domain;

an inverse Fourier transform unit configured to perform an inverse Fourier transform on an output of the frequency-axis equalization unit and output an equalized signal in a time domain;

a known signal generating unit configured to generate the known signal superimposed on the transmitted signal;

a transmission channel estimation unit configured to estimate the transmission channel of the received signal and output a Fourier transform of coefficients representing a frequency characteristic of the transmission channel;

a reliability information generating unit configured to generate, from variations in a transmission channel amplitude characteristic of the output of the transmission channel estimation unit in a transmission frequency band, reliability information representing reliability of the signal output from the inverse Fourier transform unit; and a Viterbi decoding unit configured to perform a Viterbi decoding process based on the output of the inverse Fourier transform unit and the reliability information to recover the transmitted data; wherein the frequency-axis equalization unit corrects the output of the Fourier transform unit on a basis of the output of the transmission channel estimation unit.

2. The reception device of claim 1, wherein the reliability information generating unit comprises:

a weighting coefficient decision unit configured to determine a weighting coefficient corresponding to an absolute value of a difference between a maximum gain and a minimum gain of the output of the transmission channel estimation unit within the transmission frequency band;

an average in-band gain calculation unit configured to determine an average gain of the output of the transmission channel estimation unit within the transmission frequency band; and a weighting operation unit configured to generate the reliability information on a basis of the average gain determined by the average in-band gain calculation unit, the weighting coefficient determined by the weighting coefficient decision unit, and a given reference value; wherein the reliability information generating unit outputs, as the reliability information, information indicating reliability which increases as the absolute value of the difference between the maximum gain and the minimum gain of the output of the transmission channel estimation unit decreases within the transmission frequency band.

3. The reception device of claim 1, wherein the reliability information generating unit comprises:

an in-band variance calculation unit configured to calculate a variance of an in-band component of the output of the transmission channel estimation unit within the transmission frequency band; and a reliability information conversion unit configured to convert the variance calculated by the in-band variance calculation unit to the reliability information on a basis of a given reference value; wherein the reliability information conversion unit outputs, as the reliability information, information indicating reliability which increases as the variance decreases.

4. The reception device of claim 1, wherein the transmission channel estimation unit comprises:
   a transmission channel identification filter unit configured to filter an output of the known signal generating unit and output a result of the filtering;
   an error signal generating unit configured to determine an error of an output of the transmission channel identification filter unit with respect to the signal in the given frequency band output from the frequency conversion unit;
   an identification filter coefficient calculation unit configured to receive an output of the error signal generating unit and calculate filter coefficients used by the transmission channel identification filter unit such that the output of the error signal generating unit becomes zero; and
   an identification filter coefficient Fourier transform unit configured to perform a Fourier transform on the filter coefficients calculated by the identification filter coefficient calculation unit and output a result of the Fourier transform; wherein
   the transmission channel identification filter unit uses the filter coefficients calculated by the identification filter coefficient calculation unit to filter and output the output of the known signal generating unit; and
   the output of the identification filter coefficient Fourier transform unit is used as the output of the transmission channel estimation unit.

5. The reception device of claim 1, wherein the transmitted signal is modulated by a multivalue VSB (Vestigial Sideband) modulation system, a QPSK (Quadrature Phase Shift Keying) modulation system, or a multivalue QAM (Quadrature Amplitude Modulation) modulation system.

6. A reception device for receiving a transmitted signal modulated by convolutionally coded transmitted data, a given known signal being superimposed on the transmitted signal, at first to N-th antennas (N being an integer equal to or greater than two) and recovering the transmitted data by diversity combining the received signals, comprising:
   first to N-th frequency conversion units configured to convert signals received at the first to N-th antennas to first to N-th signals in a given frequency band;
   first to N-th Fourier transform units configured to respectively perform a Fourier transform of the first to N-th signals in the given frequency band;
   a frequency-axis diversity combining unit configured to diversity combine outputs of the first to N-th Fourier transform units and output a result of the combining;
   an inverse Fourier transform unit configured to perform an inverse Fourier transform on an output of the frequency-axis diversity combining unit and output an equalized signal in a time domain;
   a known signal generating unit configured to generate the known signal superimposed on the transmitted signal;
   first to N-th transmission channel estimation units configured to respectively generate the first to N-th signals in the given frequency band and the known signal generated by the known signal generating unit, respectively estimate transmission channels of the signals received at the first to N-th antennas, and output Fourier transforms of coefficients representing frequency characteristics of the transmission channels;
   first to N-th reliability information generating units configured to respectively generate first to N-th reliability information representing reliabilities of the outputs of the first to N-th Fourier transform units, on a basis of outputs of the first to N-th transmission channel estimation units; and
   a frequency-axis combining proportion calculation unit configured to calculate respective diversity combining proportions on a basis of the first to N-th reliability information and the outputs of the first to N-th transmission channel estimation units; wherein
   the frequency-axis diversity combining unit combines the outputs of the first to N-th Fourier transform units according to outputs of the frequency-axis combining proportion calculation unit.

7. The reception device of claim 6, wherein the frequency-axis combining proportion calculation unit comprises:
   first to N-th complex conjugation units configured to convert the outputs of the first to N-th transmission channel estimation units to complex conjugate signals thereof and output the complex conjugate signals;
   first to N-th power calculation units configured to calculate squared values of amplitudes of the outputs of the first to N-th transmission channel estimation units and output the squared values as power values;
   first to N-th power value weighting units configured to respectively weight the outputs of the first to N-th power calculation unit with the first to N-th reliability information;
   a power sum calculation unit configured to calculate a sum of outputs of the first to N-th power value weighting units; and
   first to N-th combining proportion generating the diversity combining proportions for the outputs of the first to N-th Fourier transform units, on a basis of the outputs of the first to N-th complex conjugation unit, the first to N-th reliability information, and an output of the power sum calculation unit.

8. The reception device of claim 6, wherein:
   the first to N-th transmission channel estimation units are provided in association with the first to N-th frequency conversion units, and each of the first to N-th transmission channel estimation units comprises:
   a transmission channel identification filter unit configured to filter an output of the known signal generating unit and output a result of the filtering;
   an error signal generating unit configured to determine an error of an output of the transmission channel identification filter unit with respect to the signal in the given frequency band output from the associated frequency conversion unit;
   an identification filter coefficient calculation unit configured to receive an output of the error signal generating unit and calculating filter coefficients used by the transmission channel identification filter unit such that the output of the error signal generating unit becomes zero; and
   an identification filter coefficient Fourier transform unit configured to perform a Fourier transform on the filter coefficients calculated by the identification filter coefficient calculation unit and output a result of the Fourier transform; wherein
   the transmission channel identification filter unit uses the filter coefficients calculated by the identification filter coefficient calculation unit to filter the output of the known signal generating unit and outputs the result of the filtering; and the output of the identification filter coefficient Fourier transform unit is used as the output of the transmission channel estimation units.

9. The reception device of claim 6, wherein:
the first to N-th reliability information generating units are provided in association with the first to N-th transmission channel estimation units, and each of the first to N-th reliability information generating units comprises:
an in-band variance calculation unit configured to calculate a variance of an in-band component of the output of the transmission channel estimation unit associated with the reliability information generating unit within the transmission frequency band; and
a reliability information conversion unit configured to convert the variance calculated by the in-band variance calculation unit to the reliability information on a basis of a given reference value; wherein
the reliability information conversion unit outputs, as the reliability information, information indicating reliability which increases as the variance decreases.

10. The reception device of claim 6, wherein
the first to N-th reliability information generating units are provided respectively in association with the first to N-th transmission channel estimation units, and
each of the first to N-th reliability information generating units
outputs, as the reliability information, information indicating reliability which increases as an absolute value of a difference between a maximum gain and a minimum gain, within the transmission frequency band, of the output of the transmission channel estimation unit associated with the reliability information generating unit decreases.

11. The reception device of claim 10, wherein each of the first to N-th reliability information generating units comprises:
a weighting coefficient decision unit configured to determine a weighting coefficient corresponding to the absolute value of the difference between the maximum gain and the minimum gain, within the transmission frequency band, of the output of the transmission channel estimation unit associated with the reliability information generating unit;
an average in-band gain calculation unit configured to determine an average gain of the output of the associated transmission channel estimation unit within the transmission frequency band; and
a weighting operation unit configured to generate the reliability information on a basis of the average gain determined by the average in-band gain calculation unit, the weighting coefficient determined by the weighting coefficient decision unit, and a given reference value, and output the reliability information.

12. A reception device for receiving a transmitted signal modulated by convolutionally coded transmitted data, a given known signal being superimposed on the transmitted signal, at first to N-th antennas (N being an integer equal to or greater than two) and recovering the transmitted data by diversity combining the received signals, comprising:
first to N-th frequency conversion units configured to convert signals received at the first to N-th antennas to first to N-th signals in a given frequency band;
first to N-th Fourier transform units configured to respectively perform a Fourier transform on the first to N-th signals in the given frequency band;
first to N-th frequency-axis equalization units configured to respectively perform outputs of the first to N-th Fourier transform units and respectively perform corrections, in a frequency domain, for distortion suffered in transmission channels by the signals received at the first to N-th antennas, thereby performing equalization in the frequency domain;
a post-equalization frequency-axis diversity combining unit configured to diversity combine outputs of the first to N-th frequency-axis equalization units and output a result of the combining;
an inverse Fourier transform unit configured to perform an inverse Fourier transform on an output of the frequency-axis diversity combining unit to output an equalized signal in a time domain;
a known signal generating unit configured to generate the known signal superimposed on the transmitted signal;
first to N-th transmission channel estimation units configured to respectively receive the first to N-th signals in the given frequency band and the known signal generated by the known signal generating units, respectively estimate transmission channels of the signals received at the first to N-th antennas, and output Fourier transforms of coefficients representing frequency characteristics of the transmission channels;
first to N-th reliability information generating units configured to respectively generate first to N-th reliability information representing reliabilities of the outputs of the first to N-th Fourier transform units, respectively, on a basis of outputs of the first to N-th transmission channel estimation units; and
a post-equalization frequency-axis combining proportion calculation unit configured to calculate respective diversity combining proportions on a basis of the first to N-th reliability information and the outputs of the first to N-th transmission channel estimation units; wherein
the post-equalization frequency-axis diversity combining unit combines the outputs of the first to N-th frequency-axis equalization mean units according to outputs of the post-equalization frequency-axis combining proportion calculation unit; and
the first to N-th frequency-axis equalization units also receive the outputs of the first to N-th transmission channel estimation units, and perform the corrections of the first to N-th Fourier transform units on a basis thereof.

13. The reception device of claim 12, wherein the post-equalization frequency-axis combining proportion calculation unit comprises:
first to N-th power calculation units configured to calculate squared values of amplitudes of the outputs of the first to N-th transmission channel estimation units and output the squared values as power values;
first to N-th power value weighting units configured to respectively weight outputs of the first to N-th power calculation units with the first to N-th reliability information;
a power sum calculation unit configured to calculate a sum of outputs of the first to N-th power value weighting units; and
first to N-th post-equalization combining proportion generating units configured to be responsive to the outputs of the first to N-th power value weighting units and the output of the power sum calculation unit, to respectively calculate and output the diversity combining proportions for the outputs of the first to N-th frequency-axis equalization units.

14. A reception method for receiving a transmitted signal modulated by convolutionally coded transmitted data, a given known signal being superimposed on the transmitted signal, and recovering the transmitted data from the received signal, comprising:

a frequency conversion step for converting the received signal to a signal with a given frequency band;

a Fourier transform step for performing a Fourier transform of the signal in the given frequency band;

a frequency-axis equalization step for correcting, in a frequency domain, on a basis of a result of the Fourier transform in the Fourier transform step, distortion suffered in a transmission channel by the received signal, thereby performing equalization in the frequency domain;

an inverse Fourier transform step for performing an inverse Fourier transform on a result of the equalization in the frequency-axis equalization step and generating an equalized signal in a time domain;

a known signal generating step for generating the known signal superimposed on the transmitted signal;

a transmission channel estimation step for estimating the transmission channel of the received signal and performing a Fourier transform on coefficients representing a frequency characteristic of the transmission channel;

a reliability information generating step for generating, from variations in a transmission channel amplitude characteristic of an estimation result in the transmission channel estimation step, reliability information representing reliability of a result of the inverse Fourier transform in the inverse Fourier transform step; and a Viterbi decoding step for performing a Viterbi decoding process based on the result of the inverse Fourier transform in the inverse Fourier transform step and the reliability information to recover the transmitted data; wherein the frequency-axis equalization step performs a correction on the result of the Fourier transform in the Fourier transform step, on the basis of the estimation result in the transmission channel estimation step.

15. The reception method of claim 14, wherein the reliability information generating step comprises:

a weighting coefficient decision step for determining a weighting coefficient corresponding to an absolute value of a difference between a maximum gain and a minimum gain of the estimation result in the transmission channel estimation step within the transmission frequency band;

an average in-band gain calculation step for determining an average gain of the estimation result in the transmission channel estimation step within the transmission frequency band; and a weighting operation step for generating the reliability information on a basis of the average gain determined in the average in-band gain calculation step, the weighting coefficient determined in the weighting coefficient decision step, and a given reference value; wherein the reliability information generating step generates, as the reliability information, information indicating reliability which increases as the absolute value of the difference between the maximum gain and the minimum gain of the estimation result in the transmission channel estimation step decreases within the transmission frequency band.

16. The reception methods of claim 14, wherein the reliability information generating step comprises:

an in-band variance calculation step for calculating a variance of an in-band component of the estimation result in the transmission channel estimation step in the transmission frequency band; and a reliability information conversion step for converting the variance calculated in the in-band variance calculation step to the reliability information on a basis of a given reference value; wherein the reliability information conversion step generates, as the reliability information, information indicating reliability which increases as the variance decreases.

17. The reception method of claim 14, wherein the transmission channel estimation step comprises:

a transmission channel identification filtering step for filtering the known signal generated in the known signal generating step;

an error signal generating step for determining an error of a result of the filtering in the transmission channel identification filtering step with respect to the signal in the given frequency band;

an identification filter coefficient calculation step for calculating filter coefficients used in the transmission channel identification filtering step such that the error signal generated in the error signal generating step becomes zero; and an identification filter coefficient Fourier transform step for performing a Fourier transform on the filter coefficients calculated in the identification filter coefficient calculation step; and wherein the transmission channel identification filtering step filters the known signal generated in the known signal generating step by using the filter coefficients calculated in the identification filter coefficient calculation step; and a result of the Fourier transform in the identification filter coefficient Fourier transform step is used as the estimation result in the transmission channel estimation step.

18. The reception method of claim 14, wherein the transmitted signal is modulated by a multivalue VSB (Vestigial Sideband) modulation system, a QPSK (Quadrature Phase Shift Keying) modulation system, or a multivalue QAM (Quadrature Amplitude Modulation) modulation system.

19. A reception method for receiving a transmitted signal modulated by convolutionally coded transmitted data, a given known signal being superimposed on the transmitted signal, at first to N-th antennas (N being an integer equal to or greater than two) and recovering the transmitted data by diversity combining the received signals, comprising:

first to N-th frequency conversion steps for respectively converting signals received at the first to N-th antennas to first to N-th signals in a given frequency band;

first to N-th Fourier transform steps for performing respective Fourier transforms on the first to N-th signals in the given frequency band;

a frequency-axis diversity combining step for diversity combining results of the Fourier transforms in the first to N-th Fourier transform steps;

an inverse Fourier transform step for performing an inverse Fourier transform on a result of the combining in the frequency-axis diversity combining step and generating an equalized signal in a time domain;

a known signal generating step for generating the known signal superimposed on the transmitted signal;

first to N-th transmission channel estimation steps for respectively estimating transmission channels of the signals received at the first to N-th antennas, on a basis of the first to N-th signals in the given frequency band and the known signal generated in the known signal generating step, and performing Fourier transforms on coefficients representing frequency characteristics of the transmission channels;

first to N-th reliability information generating steps for generating first to N-th reliability information representing reliabilities of the results of the Fourier transforms in the first to N-th Fourier transform steps, respectively, on a basis of estimation results in the first to N-th transmission channel estimation steps; and a frequency-axis combining proportion calculation step for calculating respective diversity combining proportions on a basis of the first to N-th reliability information and estimation results in the first to N-th transmission channel estimation steps; wherein the frequency-axis diversity combining step combines the results of the Fourier transforms in the first to N-th Fourier transform steps according to the combining proportions calculated in the frequency-axis combining proportion calculation step.

20. The reception method of claim 19, wherein the frequency-axis combining proportion calculation step comprises:

first to N-th complex conjugation steps for converting the estimation results in the first to N-th transmission channel estimation steps to complex conjugate signals thereof;

first to N-th power calculation steps for calculating squared values of the amplitudes of the estimation results in the first to N-th transmission channel estimation steps as power values;

first to N-th power value weighting steps for respectively weighting the power values calculated in the first to N-th power calculation steps with the first to N-th reliability information;

a power sum calculation step for calculating a sum of results of the weighting in the first to N-th power value weighting steps; and first to N-th combining proportion generating steps for respectively calculating the diversity combining proportions for the results of the Fourier transforms in the first to N-th Fourier transform steps, on a basis of the complex conjugate signals generated in the first to N-th complex conjugation steps, the first to N-th reliability information, and the sum calculated in the power sum calculation step.

21. The reception method of claim 19, wherein:

the first to N-th transmission channel estimation steps respectively correspond to the first to N-th frequency conversion steps, and each of the first to N-th transmission channel estimation steps comprises:

a transmission channel identification filtering step for filtering the known signal generated by the known signal generating step;

an error signal generating step for determining an error of a filtering result in the transmission channel identification filtering step with respect to the signal in the given frequency band generated in the corresponding frequency conversion step; and an identification filter coefficient calculation step for calculating filter coefficients used in the transmission channel identification filtering step such that the error signal generated in the error signal generating step becomes zero; and an identification filter coefficient Fourier transform step for performing a Fourier transform on the filter coefficients calculated in the identification filter coefficient calculation step; wherein the transmission channel identification filtering step filters the known signal generated by the known signal generating step by using the filter coefficients calculated in the identification filter coefficient calculation step; and the result of the Fourier transform in the identification filter coefficient Fourier transform step is used as the estimation result in the transmission channel estimation step.

22. The reception method of claim 19, wherein;

the first to N-th reliability information generating steps respectively correspond to the first to N-th transmission channel estimation steps, and each of the first to N-th reliability information generating steps comprises:

an in-band variance calculation step for calculating a variance of an in-band component of the estimation result in the transmission channel estimation step corresponding to the reliability information generating step within the transmission frequency band; and a reliability information conversion step for converting the variance calculated in the in-band variance calculation step to the reliability information, on a basis of a given reference value; wherein the reliability information conversion step generates, as the reliability information, information indicating reliability which increases as the variance decreases.

23. The reception method of claim 19, wherein the first to N-th reliability information generating steps respectively correspond to the first to N-th transmission channel estimation steps, and each of the first to N-th reliability information generating steps generates, as the reliability information, information indicating reliability which increases as an absolute value of a difference between a maximum gain and a minimum gain, within the transmission frequency band, of the estimation result in the transmission channel estimation step corresponding to the reliability information generating step decreases.

24. The reception method of claim 23, wherein each of the first to N-th reliability information generating steps comprises:

a weighting coefficient decision step for determining a weighting coefficient corresponding to the absolute value of the difference between the maximum gain and the minimum gain, within the transmission frequency band, of the estimation result in the transmission channel estimation step corresponding to the reliability information generating step;

an average in-band gain calculation step for determining an average gain of the estimation result in the corresponding transmission channel estimation step within the transmission frequency band; and a weighting operation step for generating the reliability information on a basis of the average gain determined in the average in-band gain calculation step, the weighting coefficient determined in the weighting coefficient decision step, and a given reference value.

25. A reception method for receiving a transmitted signal modulated by convolutionally coded transmitted data, a given known signal being superimposed on the transmitted signal, at first to N-th antennas (N being an integer equal to or greater than two) and recovering the transmitted data by diversity combining the received signals, comprising:

first to N-th frequency conversion steps for respectively converting signals received at the first to N-th antennas to first to N-th signals in a given frequency band;

first to N-th Fourier transform steps for respectively performing Fourier transforms on the first to N-th signals in the given frequency band;

first to N-th frequency-axis equalization steps for respectively performing corrections, in a frequency domain, on a basis of results of the Fourier transforms in the first to N-th Fourier transform steps, for distortion suffered in transmission channels by the signals received at the first to N-th antennas, thereby performing equalization in the frequency domain;

a post-equalization frequency-axis diversity combining step for diversity combining equalization results obtained in the first to N-th frequency-axis equalization steps;

an inverse Fourier transform step for performing an inverse Fourier transform on a result of the combining in the post-equalization frequency-axis diversity combining step and generating an equalized signal in a time domain;

a known signal generating step for generating the known signal superimposed on the transmitted signal;

first to N-th transmission channel estimation steps for respectively estimating transmission channels of the signals received at the first to N-th antennas, and performing Fourier transforms on coefficients representing frequency characteristics of the transmission channels, on a basis of the first to N-th signals in the given frequency band and the known signal generated by the known signal generating step;

first to N-th reliability information generating steps for respectively generating first to N-th reliability information representing reliabilities of the results of the Fourier transforms in the first to N-th Fourier transform steps, respectively, on a basis of estimation results in the first to N-th transmission channel estimation steps; and a post-equalization frequency-axis combining proportion calculation step for calculating respective diversity combining proportions on a basis of the first to N-th reliability information and the estimation results in the first to N-th transmission channel estimation steps; wherein the post-equalization frequency-axis diversity combining step combines the equalization results in the first to N-th frequency-axis equalization steps according to the combining proportions calculated in the post-equalization frequency-axis combining proportion calculation step; and the first to N-th frequency-axis equalization steps perform the corrections of the first to N-th Fourier transform steps on a basis also of the estimation results in the first to N-th transmission channel estimation steps, respectively.

26. The reception method of claim 25, wherein the post-equalization frequency-axis combining proportion calculation step comprises:

first to N-th power calculation steps for calculating squared values of amplitudes of the estimation results in the first to N-th transmission channel estimation steps as power values;

first to N-th power value weighting steps for respectively weighting the power values calculated in the first to N-th power calculation steps with the first to N-th reliability information;

a power sum calculation step for calculating a sum of results of the weighting in the first to N-th power value weighting steps; and first to N-th post-equalization combining proportion generating steps for calculating the respective diversity combining proportions for the equalization results in the first to N-th frequency-axis equalization steps, on a basis of the results of the weighting in the first to N-th power value weighting steps and the sum calculated in the power sum calculation step.

* * * * *